United States Patent [19]
Tomzig et al.

[11] Patent Number: 5,462,011
[45] Date of Patent: Oct. 31, 1995

[54] METHOD FOR PULLING SINGLE CRYSTALS

[75] Inventors: Erich Tomzig, Burgkirchen; Reinhard Wolf, Emmerting; Wolfgang Hensel, Burghausen, all of Germany

[73] Assignee: Wacker-Chemitronic Gesellschaft für Elektronik-Grundstoffe mbH, Burghausen, Germany

[21] Appl. No.: 248,753

[22] Filed: May 25, 1994

[30] Foreign Application Priority Data

Jun. 1, 1993 [DE] Germany .......................... 43 18 184.8

[51] Int. Cl.⁶ .................................................. C30B 15/20
[52] U.S. Cl. .................. 117/18; 117/19; 117/20; 117/217
[58] Field of Search .................. 117/13, 14, 18, 117/19, 20, 32, 33, 51, 3, 35, 217; 373/144

[56] References Cited

U.S. PATENT DOCUMENTS

| | | | |
|---|---|---|---|
| 2,961,305 | 11/1960 | Dash | 117/34 |
| 3,607,139 | 9/1971 | Hanks | 117/35 |
| 3,936,346 | 2/1976 | Lloyd | 117/32 |
| 4,366,024 | 12/1982 | Ast et al. | 117/18 |
| 4,659,421 | 4/1987 | Jewett | 117/32 |
| 5,030,315 | 7/1991 | Washizuka et al. | 117/18 |

FOREIGN PATENT DOCUMENTS 1286987  11/1989  Japan ....................................... 117/18

*Primary Examiner*—Robert Kunemund
*Assistant Examiner*—Felisa Garrett
*Attorney, Agent, or Firm*—Collard & Roe

[57] ABSTRACT

A method and apparatus for pulling single crystals from a melt of semiconductor material, in which a monocrystalline seed crystal grows to form a single crystal, the seed crystal being dipped into the melt and raised in a controlled manner in the vertical direction with respect to the melt, while the melt forms a molten pool which is held on a support body only by the surface tension and by electromagnetic forces due to an induction coil. This method includes recharging the melt with semiconductor material in solid or liquid form during the growth of the single crystal.

8 Claims, 4 Drawing Sheets

METHOD FOR PULLING SINGLE CRYSTALS

BACKGROUND OF THE INVENTION

1. Field of the Invention

The present invention relates to a method for pulling single crystals from a melt of semiconductor material, in which a monocrystalline seed crystal grows to form a single crystal, the seed crystal being dipped into the melt and raised in a controlled manner in the vertical direction with respect to the melt, while the melt forms a molten pool which is held on a support body only by the surface tension and by electromagnetic forces due to an induction coil. The invention furthermore relates to an apparatus for carrying out the method.

2. The Prior Art

The growth of single crystals by such a method, also referred to as "pedestal pulling," differs from the method of growing single crystals most frequently used in semiconductor technology, the so-called Czochralski method, mainly in that, in the case of the latter, a crucible accommodates the melt of the semiconductor material. As a rule, the internal walls of the crucible which come into contact with the melt in this process are made of quartz, which slowly begins to dissolve in the melt at high temperatures. As a result, impurities such as, for example, oxygen, boron and aluminum originating from the quartz are incorporated into the lattice of the growing single crystal. In some applications in semiconductor technology, for example in the production of electronic power components, however, single crystals which are not contaminated with oxygen, or are contaminated only with small amounts of it, are required as raw materials. A crucible-free crystal pulling technique, such as the "floating zone" or the "pedestal pulling" technique is preferred for the production of such single crystals. In the case of the method first mentioned, a cylindrical ingot of polycrystalline semiconductor material is melted at one end by means of an induction coil, a monocrystalline seed crystal is dipped into the melt and a relative movement of ingot and coil ensures that a molten zone slowly migrates through the polycrystalline ingot from the seed-crystal end. The semiconductor material melted in the molten zone recrystallizes in monocrystalline form, with the result that a single crystal is finally obtained. A disadvantage of this method is that the mass of the polycrystalline ingot limits the mass of the single crystal and the polycrystalline ingots used cannot have any desired length and any desired diameter for equipment reasons. Since it has been found advantageous for the diameter of the polycrystalline ingot and of the monocrystalline ingot to be in an approximate ratio of 1:1, polycrystalline ingots having large diameters are also required for the production of large single crystals. It can be observed that parts may chip off from the edges of large polycrystalline ingots which have diameters of 150 mm and greater and which are normally produced by depositing the semiconductor material on a so-called slim rod, because of the brittleness of the semiconductor material even under very low mechanical, or thermal, stress. If this takes place during the growth of a single crystal, there is a danger of the formation of dislocations in the crystal lattice, with the result that the crystal becomes unusable for electronic applications.

U.S. Pat. No. 2,961,305 describes a method of producing single crystals by "pedestal pulling". In the method disclosed therein, a disk of semiconductor material resting on a segmented support body is first melted inductively. Then a monocrystalline seed crystal is dipped into the melt and raised in a controlled manner in the vertical direction with respect to the melt. As the molten semiconductor material is used up, the seed crystal grows to form an ingot-shaped single crystal. Since the segmented support body is also composed of the semiconductor material in this prior art method, and since the support body is directionally melted as a consequence of the heat transmission from the melt itself, which rests on it, and on the moving inductive heating system, a single crystal can be grown whose maximum achievable mass is approximately equal to the sum of the masses of the disk and of the support body. In addition to limiting the achievable size of the single crystal in an unfavorable manner in this prior art method as well, a particular disadvantage in this case is that the support body produced with high costs is destroyed in the course of the method.

U.S. Pat. No. 3,936,346 discloses another example of the "pedestal pulling" method. The method described therein is that a polycrystalline semiconductor ingot is continuously pushed from below into a cage formed by induction coils and open at the bottom and top. The part of the semiconductor ingot which is precisely in the cage melts and forms a melt which does not touch the sidewalls of the cage because of the surface tension of the semiconductor material and because of the electromagnetic forces generated by the coils. At the beginning of this method, a melt is generated in the cage by introducing the polycrystalline ingot. Then a monocrystalline seed crystal is dipped into the melt and raised in a controlled manner in the vertical direction with respect to the melt, and material continuously grows on the seed crystal from the melt. Feeding the polycrystalline semiconductor ingot forward ensures that the amount of melt in the cage remains constant. In this prior art method, too, there is the disadvantageous dependence, already mentioned, of the mass of the single crystal on that of the polycrystalline sacrificial ingot.

SUMMARY OF THE INVENTION

It is an object of the present invention to provide a method and an apparatus for pulling single crystals, with which the specified disadvantages of the prior art are overcome.

The above object is achieved according to the present invention by providing a method for pulling single crystals from a melt of semiconductor material, in which a monocrystalline seed crystal grows to form a single crystal, the seed crystal being dipped into the melt and raised in a controlled manner in the vertical direction with respect to the melt, while the melt forms a molten pool which is held on a support body only by surface tension and by electromagnetic forces due to an induction coil, which method also comprises recharging the melt with semiconductor material in solid or liquid form during the growth of the single crystal.

This object is furthermore achieved by an apparatus for carrying out the method which comprises an apparatus for pulling a single crystal from a melt of semiconductor material. The apparatus includes a support body on which the melt rests, and a pulling device with whose aid a monocrystalline seed crystal is dipped into the melt and raised in a controlled manner vertically with respect to the melt. An induction coil having an opening is mounted at a short distance from the melt surface and surrounds the growing single crystal annularly. Means are also provided for recharging liquid or solid semiconductor material.

At least that part of the support body which comes into contact with the molten pool is preferably made of the semiconductor material of which the single crystal to be produced is composed. It is furthermore advantageous to make at least that part of the support body heatable which adjoins the molten pool. Various possibilities are available for this purpose, for example, heating by means of a resistance heating system or an induction heating system. The additional heating of the support body effectively assists the induction coil, which serves as heat source for the generation and/or maintenance of the molten pool, and this can compensate for heat losses which inevitably occur during the recharging of the semiconductor material. The induction coil is preferably of flat construction and is situated above the support body. The distance from the support body is variable.

One way of generating the molten pool is for solid semiconductor material to be placed on the support body at the start of the process and for the support body to be heated by the additional heat source to such an extent that the semiconductor material resting on it can be melted with the aid of the induction coil, under which circumstances the molten pool is formed. In principle, the semiconductor material can also be poured onto the preheated support body already in the liquid state and the molten pool can be generated in this manner with the aid of the inductive heating. In this connection, it is particularly advantageous if the surface of the support body is of concave design. A further preferred method is to generate the molten pool by melting the support body itself with the aid of the additional heat source and the induction coil. This is preferably achieved by preheating at least that part of the support body which is adjacent to the induction coil with the aid of the additional heat source and then melting it with the aid of the induction coil to such an extent that a molten pool is produced.

The depth of the molten pool is essentially determined by the applied power of the two heat sources. Although not absolutely necessary, it has nevertheless been found advantageous to melt enough semiconductor material for the depth of the molten pool to be in the range of 20 to 50 mm.

In the further steps of the method, as is usual in "pedestal pulling," the monocrystalline seed crystal is lowered through the internal hole of the induction coil onto the surface of the molten pool, dipped into the melt and raised vertically with respect to the melt surface. Further features of the method which are part of the prior art, that the growing single crystal and/or the support body are rotated during the crystal pulling and that the diameter of the single crystal is predetermined by the choice of pulling speed, are assumed to be known in the further course of this description. This also applies to the doping method which is usual in "pedestal pulling." Optionally, during the pulling of the single crystal, gaseous compounds of the doping elements can be blown onto the melt or dopants can be added to the recharging material in solid form.

The decrease in molten semiconductor material which accompanies the growth of the single crystal is preferably compensated for by continuously recharging fresh semiconductor material. In a further embodiment, the recharging can also be carried out cyclically. In the particularly preferred embodiment, the semiconductor material is fed to the molten pool in the molten state through a quartz tube directed at the molten pool. In principle, solid semiconductor material, for example in the form of granules, can also be fed directly to the molten pool through a quartz tube directed at the molten pool. In this embodiment, it is particularly advantageous to prevent the granules from reaching the phase boundary of the growing crystal, or the edge of the molten pool, by suitably designing the quartz tube, or by means of a suitably shaped quartz ring projecting into the melt.

A further embodiment for recharging solid semiconductor material is to dip a polycrystalline semiconductor ingot into the molten pool at an acute angle to the surface of the support body and to melt it in accordance with the freshly required amount of melt. The supply of fresh semiconductor material can be terminated or interrupted at any time by pulling the polycrystalline semiconductor ingot out of the molten pool.

Semiconductor material which is to be recharged in liquid form must be melted beforehand in a pre-melt crucible provided for the purpose and accommodating solid semiconductor material. The pre-melt crucible is heated as far as possible directly by means of the induction coil, or by means of a separate crucible heating system, in accordance with its geometrical requirements. If the semiconductor material to be melted is available in granular form, the melting energy is normally supplied by means of the induction coil. In the case of dust, coarser fragments or ingots, it is more advantageous for geometrical reasons to heat the pre-melt crucible using a separate crucible heating system, in particular a resistance heating system.

The addition of molten semiconductor material to the molten pool to meet the requirements is carried out, for example, in such a way that, as a result of controlling the heating power, precisely as much semiconductor material is melted in the pre-melt crucible as is required for the continuous pulling of a single crystal. In the embodiment for the direct heating of the pre-melt crucible by the induction coil, the amount of the material to be recharged is preferably regulated by means of a dispensing device, for example by means of a temperature-controlled capillary. Correspondingly, if solid granules are added directly to the melt, the required amount is recharged by means of a dispensing device, for example with a vibrating conveyor.

Regardless of the crucible volume, this ensures that liquid semiconductor material comes into contact with the crucible inside wall, which is as a rule made of quartz, and takes up oxygen and other impurities in doing so only for a short time and in a comparatively small amount.

The pulling of the single crystal is terminated when the single crystal has reached a specified length, or a length corresponding to the maximum dimension of the pulling equipment. For this purpose, the supply of recharged semiconductor material to a molten pool is terminated and, at the same time, the pulling speed is increased, with the result that the end of the single crystal adjacent to the melt is narrowed conically until it finally loses contact with the melt. In principle, after the pulled single crystal has been removed and a short time required to restore optimum pulling conditions, the pulling equipment is ready for a new cycle in the method. The molten pool is maintained during this time. The new cycle in the method is initiated by dipping a seed crystal into the melt and raising it in a controlled manner in the vertical direction with respect to the melt and by recharging semiconductor material consumed by the growth of the single crystal.

Advantageously, in the case of prolonged stoppage times of the pulling equipment, the support body is restored to its original state by mechanical machining, in which process deformations which have formed during solidification of the melt are eliminated again.

BRIEF DESCRIPTION OF THE DRAWINGS

Other objects and features of the present invention will become apparent from the following detailed description considered in connection with the accompanying drawings, and examples, which disclose the embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
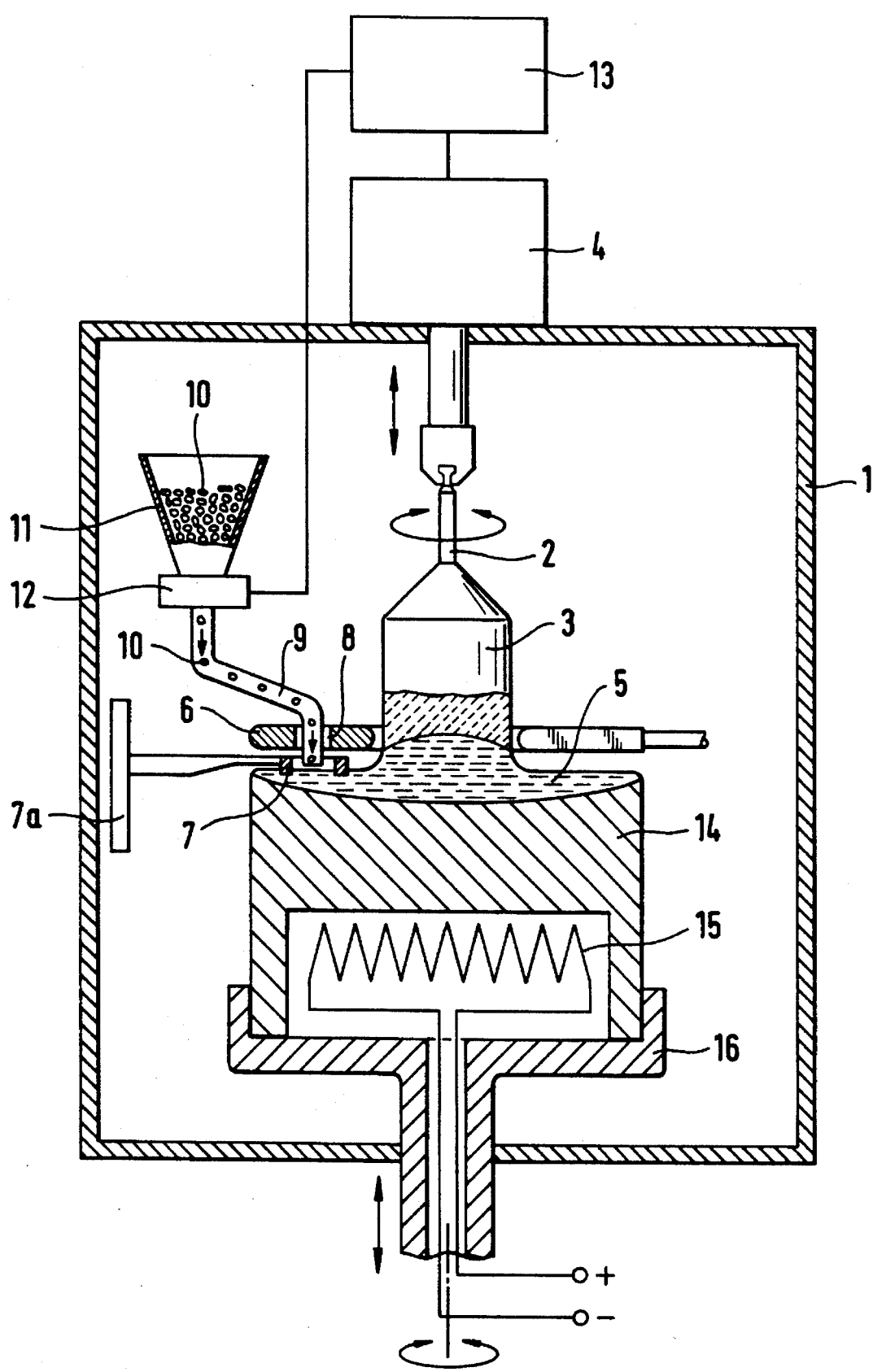
FIG. 1 shows an apparatus for recharging solid semiconductor material which is fed directly into the melt.

Turning now in detail to the drawings, FIG. 1 shows an apparatus which incorporates a gas-tight housing 1 which is evacuated or flushed with inert gas during the pulling of the single crystal. In the drawing, the monocrystalline seed crystal 2 has already grown to form a fairly large cylindrical single crystal 3 which is raised in a controlled manner by means of a pulling device 4 in the vertical direction with respect to the semiconductor melt 5 which forms a molten pool. The induction coil 6 is mounted at a short distance from the melt surface and surrounds the single crystal annularly. With the aid of the holder 7a, a preferably annular shaped body 7 composed of quartz is held in such a way that it touches the melt surface or dips into the molten pool. Fine-grain semiconductor material 10 from the feedstock container 11 is fed via the feed pipe 9 into the shaped body 7, and consequently into the melt through the opening 8 in the induction coil 6 with the aid of the dispensing device 12. Only as much solid semiconductor material is able to leave the feedstock container 11 as is permitted by the dispensing device 12.

The dispensing device 12 is controlled by a regulating device 13 which evaluates the current pulling parameters such as, for example, the pulling speed and the diameter of the single crystal. The molten pool rests on the support body 14, which can be heated by means of the resistance heating system 15 as an additional heat source. Preferably, the support body 14 is not formed from a single piece but is made up of a plurality of segments. As a result of suitably shaping the segments, a cavity for accommodating the additional heat source 15 can be formed in a simple manner. In a preferred embodiment, the support body is held by a rotatable supporting device 16, whose height is adjustable.

Figure 2:
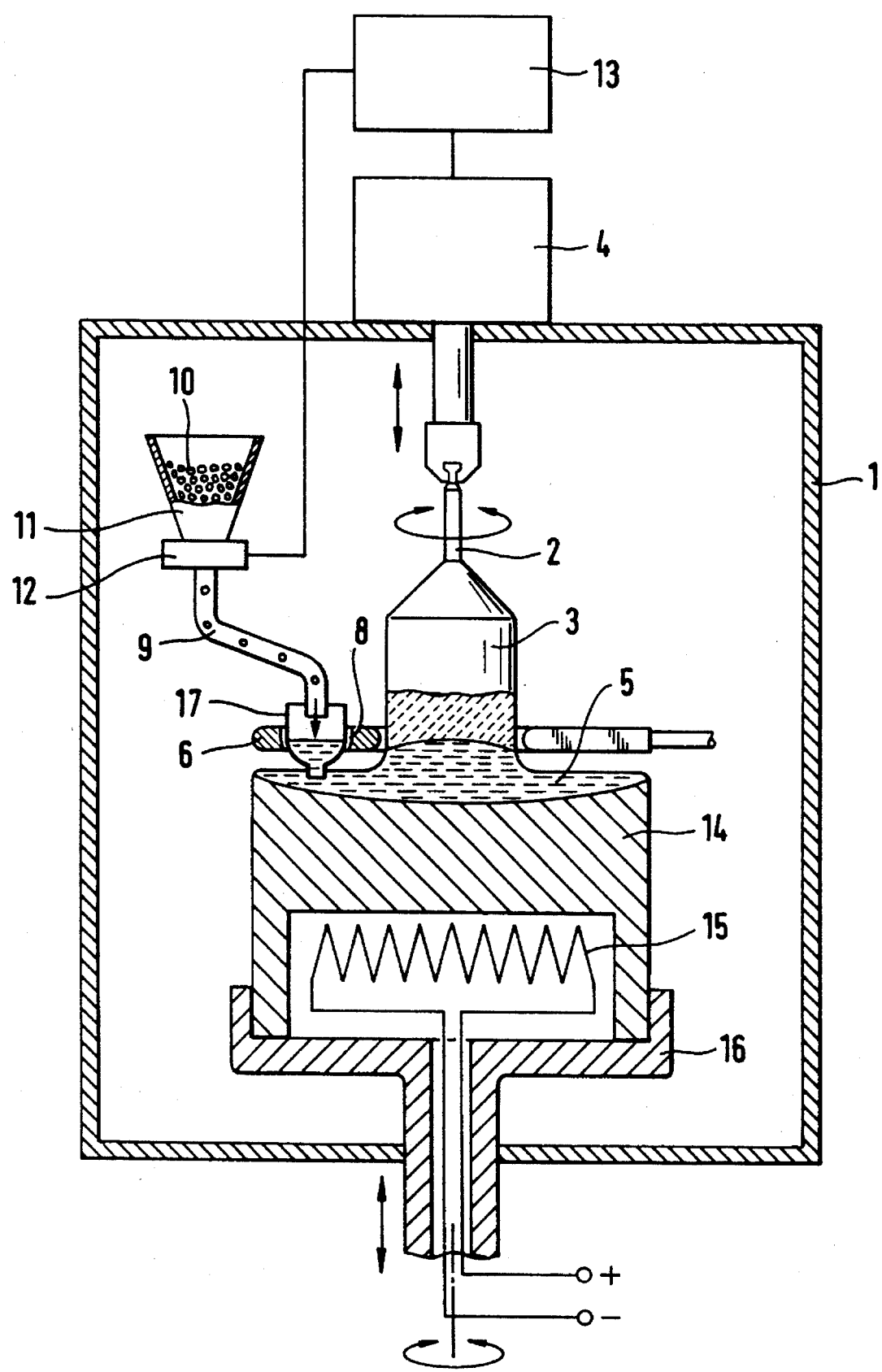
FIG. 2 shows a similar device in which the material is fed into the melt in the liquid state via a pre-melt crucible which is concomitantly heated by the induction coil.

The apparatus shown diagrammatically in FIG. 2 differs from the embodiment shown in FIG. 1, in particular, in that the semiconductor material 10 to be recharged is melted in a pre-melt crucible 17 which is concomitantly heated by the induction coil 6. The semiconductor material 10 to be recharged is fed out of the crucible 17 into the melt 5 in the liquid state.

Figure 3:
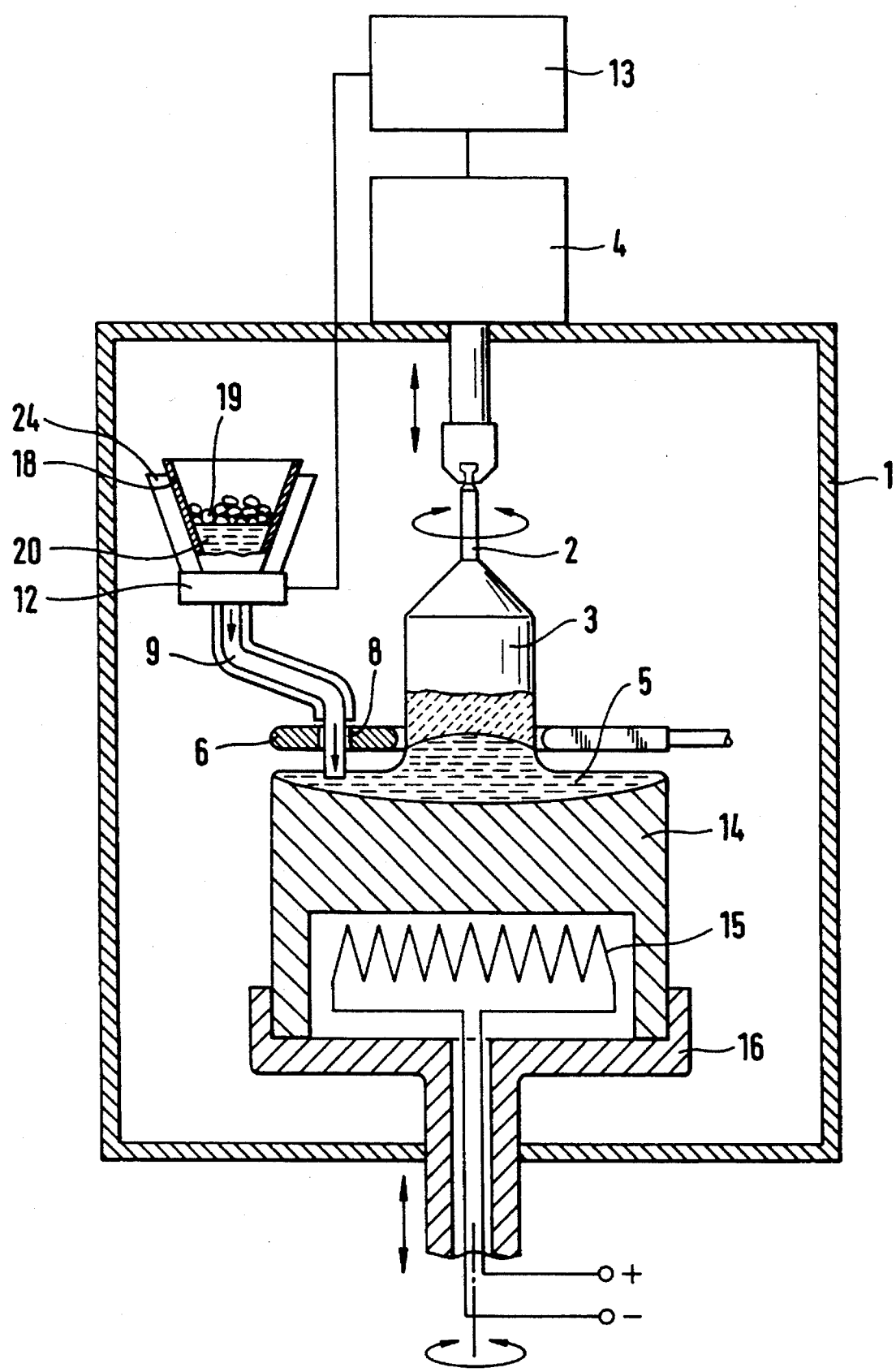
FIG. 3 shows a corresponding device having a pre-melt crucible with separate crucible heating system.

The apparatus shown diagrammatically in FIG. 3 differs from the embodiment shown in FIG. 2, in particular, in that a pre-melt crucible 18 provided with a separate crucible heating system 24 is used. The pre-melt crucible is filled, for example, with fragments 19 of semiconductor material which are to be melted. The molten semiconductor material 20 is delivered via the dispensing device 12 to a preferably heated feed pipe 9. The feed pipe extends through the opening 8 in the induction coil 6 down to the surface of the molten pool or projects into this molten pool.

Figure 4:
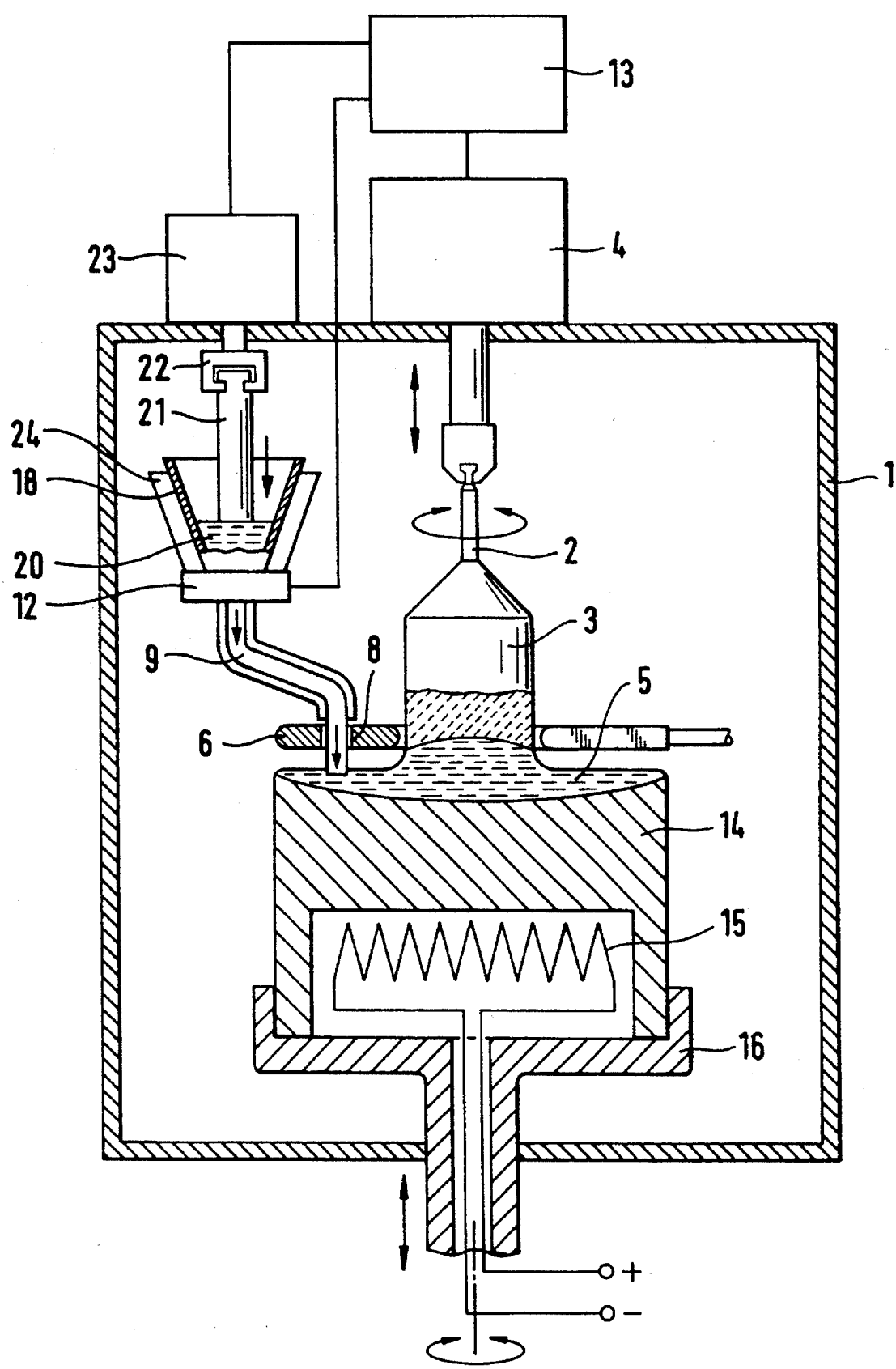
FIG. 4 shows a device with which the ingot-shaped semiconductor material can be melted in a pre-melt crucible and recharged in liquid state.

With the apparatus shown in FIG. 4, it is also possible to recharge semiconductor material in ingot form. For this purpose, a preferably polycrystalline semiconductor ingot 21 is completely or partly melted in the pre-melt crucible 18 which is fitted with a separate crucible heating system 24. For this purpose, the ingot 21 held by the holding device 22 is lowered by the lowering device 23 into the heated crucible 18, as required. The lowering device 23 is controlled by the regulating device 13.

The molten semiconductor material 20 is then fed, as in FIG. 3, via the dispensing device 12 to a preferably heated feed pipe 9 and passes from there into the melt 5.

Compared with the conventional, crucible-pulled single crystals, single crystals which are pulled by the method according to the invention are notable not only for a comparatively lower oxygen content, but they also contain markedly lower amounts of impurities because the auxiliary materials normally used in crucible pulling are not needed. The single crystals generated are therefore suitable particularly as raw material, for electronic power components. The method of the present invention makes it possible to consecutively produce one or more single crystals which have a diameter of 50 to 300 mm, preferably 100 to 150 mm, and a length of up to 2 m and greater. At the same time, this is largely independent of the state and shape of the starting material used.

EXAMPLE

In pulling equipment in accordance with FIG. 2, the heatable support body 14 was made of silicon segments, had a diameter of 400 mm and a height of 300 mm, and stood on a rotatable supporting device 16 which was adjustable in height. The segments were shaped in such a way that space was available in the interior of the support body for a resistance heating system 15 having 60 kW connection load. The connection load of the induction coil 6 mounted above the support body was 100 kW. The coil had an opening 8 through which the outlet, designed as a quartz capillary, of a pre-melt crucible 17 mounted directly above the coil was routed down to the surface of the support body as a feed pipe 9.

The loading capacity of the pre-melt crucible 17, which was made of graphite and lined with quartz, was 1 kg of silicon. The pre-melt crucible was supplied with silicon granules 10 having a mean diameter of 0.2 to 1 mm from a feedstock container 11 via a quartz supply pipe 9. Situated above the pre-melt crucible was an extraction device 1 with which dust and silicon oxide could be effectively removed. The feedstock container 11 had a loading capacity of 25 kg of silicon and was equipped with a vibrating conveyor as dispensing device 12. In addition, silicon could be added to the feedstock container from outside the pulling equipment with the aid of a lock.

At the start of the process, the pulling equipment was flushed with argon and an argon atmosphere of 2 bar was finally established. Then the support body 14 was preheated to approximately 1050° C. with the internal resistance heating system 15. The surface of the support body was melted by carefully coupling-in the induction coil 6 while simultaneously reducing the heating power of the resistance heating system 15. After a stabilizing phase of 90 minutes, a monocrystalline seed crystal 2 was dipped into the molten pool 5 produced and raised vertically with respect to the melt in accordance with the "pedestal technique." This produced a cylindrical single crystal of 154 mm diameter having a conical tip.

The recharging of molten silicon was already started during the production of the conical tip. The amount of granules 10 with which the volume of the molten pool 5 could be kept constant was calculated by a regulating device 13 as a function of the preselected pulling speed of 1.9 mm/min and the current diameter of the single crystal. The appropriate amount of granules 10 was continuously dispensed into the pre-melt melt crucible 17 from the feedstock container 11 by means of the conveyor 12. During the pulling of the cylindrical part of the single crystal 3, the amount of silicon recharged per unit of time remained constant, as did the power consumption of the induction coil (15 kW) and that of the additional resistance heating system (10 kW). After the single crystal 3 had grown to a length of 185 cm, an end cone was pulled in the normal manner and the recharging was stopped at the same time. After the pulling equipment had cooled, the support body 14 was restored to its original state by mechanical machining and then a new cycle in the process was started.

While several embodiments of the present invention have been shown and described, it is to be understood that many changes and modifications may be made thereunto without departing from the spirit and scope of the invention as defined in the appended claims.

What is claimed is:

1. A method of pulling a single crystal of silicon, comprising generating a molten pool of silicon on the top of a pedestal-shaped support body;

heating the molten pool with an induction coil, said molten pool being held on the top of the support body by the surface tension of silicon and by the electromagnetic forces of said induction coil;

dipping a silicon seed crystal into the molten pool;

raising the seed crystal in a controlled manner in the vertical direction with respect to the molten pool, so as to grow a single crystal of silicon on the seed crystal; and recharging the molten pool with silicon material in a state selected from the group consisting of solid state and liquid state during the growth of the single crystal.

2. The method as claimed in claim 1, comprising conveying silicon granules into the molten pool.

3. The method as claimed in claim 1, comprising melting silicon material in a pre-melt crucible and conveying the silicon material in the liquid state into the molten pool.

4. The method as claimed in claim 1, comprising dipping an elongated silicon body into the molten pool.

5. The method as claimed in claim 1, comprising blowing gaseous dopants onto the molten pool during the growth of the single crystal.

6. The method as claimed in claim 1, comprising adding dopants in solid form to the silicon material with which the molten pool is recharged.

7. The method as claimed in claim 1, comprising recharging the molten pool with silicon material cyclically.

8. The method as claimed in claim 1, comprising recharging the molten pool with silicon material continuously.

* * * * *